(12) United States Patent
Morgan

(10) Patent No.: US 10,980,152 B1
(45) Date of Patent: Apr. 13, 2021

(54) THERMAL RECTIFICATION WITH PHASE CHANGE MATERIALS

(71) Applicant: Seagate Technology LLC, Cupertino, CA (US)

(72) Inventor: Michael Morgan, Los Altos Hills, CA (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 16/680,059

(22) Filed: Nov. 11, 2019

(51) Int. Cl.
*H05K 7/20* (2006.01)

(52) U.S. Cl.
CPC ....... *H05K 7/20472* (2013.01); *H05K 7/2029* (2013.01)

(58) Field of Classification Search
CPC ............. H05K 7/20472; H05K 7/2029; H05K 1/0203; H01L 2924/1434; H01L 2225/06589; H01L 23/36; H01L 23/40; G06F 1/20
See application file for complete search history.

(56) References Cited

U.S. PATENT DOCUMENTS

| | | | | |
|---|---|---|---|---|
| 6,523,608 B1 * | 2/2003 | Solbrekken | ......... | H01L 23/3733 165/185 |
| 6,653,741 B2 * | 11/2003 | Sreeram | ............. | B23K 35/3602 257/781 |
| 7,839,630 B2 * | 11/2010 | Hwang | .................... | G06F 1/203 165/104.33 |
| 8,031,470 B2 | 10/2011 | Nelson et al. | | |
| 8,184,439 B2 * | 5/2012 | Baek | ........................ | H01L 23/38 165/80.3 |
| 8,477,499 B2 | 7/2013 | Hill et al. | | |
| 8,879,263 B2 * | 11/2014 | Gunderson | .......... | H05K 5/0256 29/592.1 |
| 9,282,681 B2 | 3/2016 | Rugg | | |
| 2010/0112360 A1 | 5/2010 | Delano | | |
| 2011/0308781 A1 * | 12/2011 | O'Riordan | ......... | H05K 7/20454 165/185 |

(Continued)

OTHER PUBLICATIONS

"High Performance SSD Memory Application with Compressible TIM-Based on Phase Change Technology", Honeywell Electronic Materials, Honeywell Thermal Trends 2016 covering compressible TIM based on PCM, https://www.slideshare.net/ThermalManagementHoneywell/high-performance-ssd-memory-application-with-compressible-tim-based-on-phase-change-technology, published on Apr. 7, 2016, 26 slides.

*Primary Examiner* — Binh B Tran
*Assistant Examiner* — Michael A Matey
(74) *Attorney, Agent, or Firm* — Westman, Champlin & Koehler, P.A.

(57) ABSTRACT

A data storage device includes a heat source including a memory, and an enclosure within which the heat source is installed. The data storage device also includes a heat spreader within the enclosure and surrounding the heat source. The data storage device further includes a thermal interface material within the enclosure. The thermal interface material is coupled to the heat source and to the heat spreader, thereby providing a first low thermal resistance path between the heat source and the heat spreader. A phase change material is coupled to the thermal interface material such that the thermal interface material provides a second low thermal resistance path between the heat source and the phase change material.

18 Claims, 11 Drawing Sheets

(56) References Cited

U.S. PATENT DOCUMENTS

| | | | |
|---|---|---|---|
| 2014/0306335 A1* | 10/2014 | Mataya | H01L 23/3677 257/713 |
| 2016/0172008 A1* | 6/2016 | Rugg | G11B 33/1426 360/97.12 |
| 2018/0076112 A1* | 3/2018 | Dabral | H01L 23/28 |
| 2018/0270943 A1* | 9/2018 | Suzuki | H05K 1/0203 |
| 2018/0374714 A1* | 12/2018 | Stathakis | H01L 23/373 |
| 2020/0294884 A1* | 9/2020 | Shaikh | H01L 23/38 |

* cited by examiner

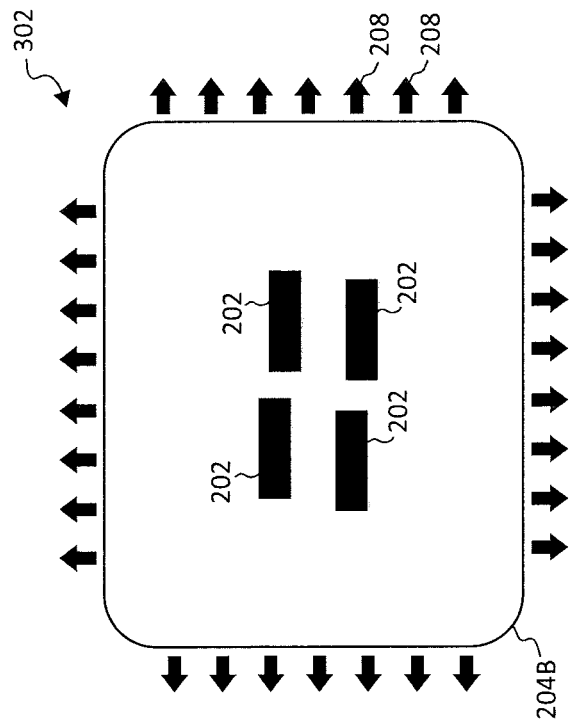
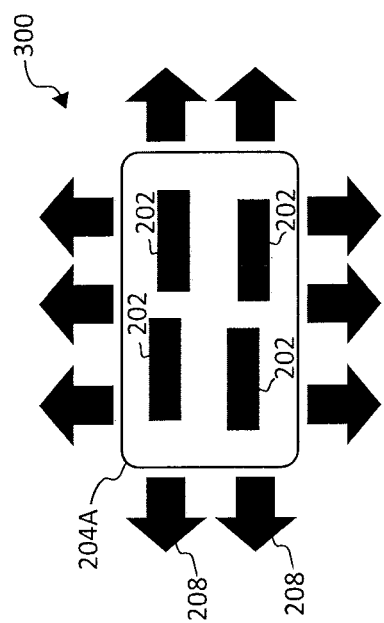
FIG. 3B
FIG. 3A

THERMAL RECTIFICATION WITH PHASE CHANGE MATERIALS

SUMMARY

In one embodiment, a data storage device is provided. The data storage device includes a heat source including a memory, and an enclosure within which the heat source is installed. The data storage device also includes a heat spreader within the enclosure and surrounding the heat source. The data storage device further includes a thermal interface material within the enclosure. The thermal interface material is coupled to the heat source and to the heat spreader, thereby providing a first low thermal resistance path between the heat source and the heat spreader. A phase change material is coupled to the thermal interface material such that the thermal interface material provides a second low thermal resistance path between the heat source and the phase change material.

In another embodiment, a method is provided. The method includes providing a vent-less enclosure, and installing a heat source having a solid-state memory in the vent-less enclosure. The method also includes introducing a phase change material within a liquid-tight container in the enclosure. The phase change material is thermally coupled to the heat source.

In yet another embodiment, a data storage device includes a vent-less enclosure and a heat source having a solid-state memory installed in the vent-less enclosure. The data storage device also includes a phase change material within a liquid-tight container in the enclosure. The phase change material is thermally coupled to the heat source.

This summary is not intended to describe each disclosed embodiment or every implementation of the thermal rectification system. Many other novel advantages, features, and relationships will become apparent as this description proceeds. The figures and the description that follow more particularly exemplify illustrative embodiments.

BRIEF DESCRIPTION OF THE DRAWINGS

FIGS. 3A and 3B are diagrammatic illustrations of devices with vent-less enclosures of different sizes.

DETAILED DESCRIPTION

Figure 1:
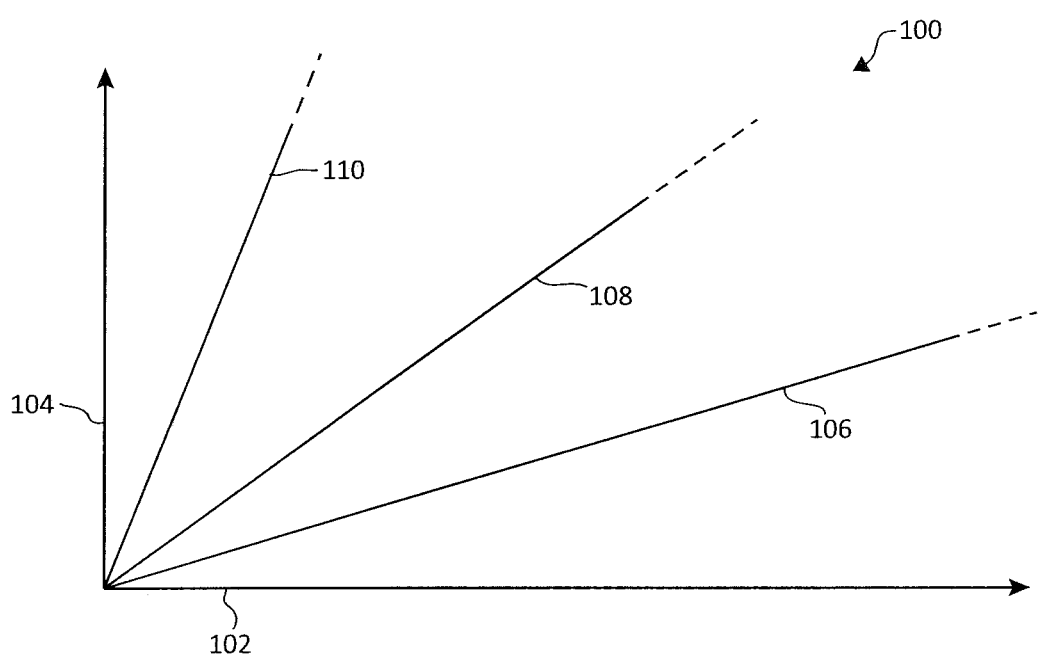
FIG. 1 is a graph that illustrates a comparison between systems with various heat capacities/heat loads.

The disclosure relates to employing phase change (PC) materials for thermal rectification in data storage devices (e.g., solid state drives (SSDs)).

Embodiments of the disclosure utilize properties of PC materials, most commonly a latent heat of fusion, to rectify/control temperatures of key components, maintaining them close to the melting point temperature of a chosen PC material. This is especially useful for portable devices that are environmentally sealed in order to prevent moisture or dust ingress, as these devices have no vent openings for natural or forced-air convective cooling. A typical use case for portable devices involves infrequent periods of operation, such as data writes to or reads from portable external storage devices, as the total energy consumed and dissipated to complete an intended data transfer action is reasonably bounded. An amount of PC material may be sized to absorb this heat energy and ensure temperatures of key components do not exceed their operating range temperature or trigger detrimental functional behavior, such as throttling the performance to reduce the heat load and consequently limit the component temperature rise. The addition of PC material enables the use of much smaller enclosures, or the use of less thermally efficient/less expensive materials for the portable device designs. Both are highly desirable attributes of portable device designs. A description of system/device temperature dependence on heat capacity is first provided herein in connection with FIGS. 1-5. Thereafter, data storage device embodiments that employ PC materials are described in connection with FIGS. 7-10.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

There are many device applications where device operation is intentionally infrequent (e.g., the device may occasionally be used when a need arises). When this occurs, the device dissipates a sudden increase in the heat load, causing internal component temperatures to rise significantly. The rate of this temperature rise depends on the heat capacity of the system and the amount of internal heat energy that is generated during operation (heat load). FIG. 1 illustrates a comparison between systems with various heat capacities/ heat loads. In graph 100 of FIG. 1, horizontal axis 102 represents time and vertical axis 104 represents system temperature. Plot 106 is a large heat capacity/small internal heat load plot; plot 108 is a medium heat capacity/medium internal heat load plot; and plot 110 is a small heat capacity/ large internal heat load plot, which shows a highest system temperature rise in a short duration of time.

Often, one or more internal components of a system/ device will have temperature specification ranges that do not have much margin, e.g., they will reach a top of their operating temperature range after a small increase in temperature. In this case, a cooling process is employed to ensure all components will remain within their specified operating temperature range. In most fixed device environments, such as data storage servers or desktop systems, a cooling fan may be employed to control the component temperature. The airflow can be increased, as needed, in order to limit the rise of the component temperatures. In portable storage environments, a cooling fan is not practical, due to water or dust ingress concerns, so system components rely upon passive cooling mechanisms, specifically natural thermal convection and radiation, to transfer the heat load into the ambient environment.

Figure 2:
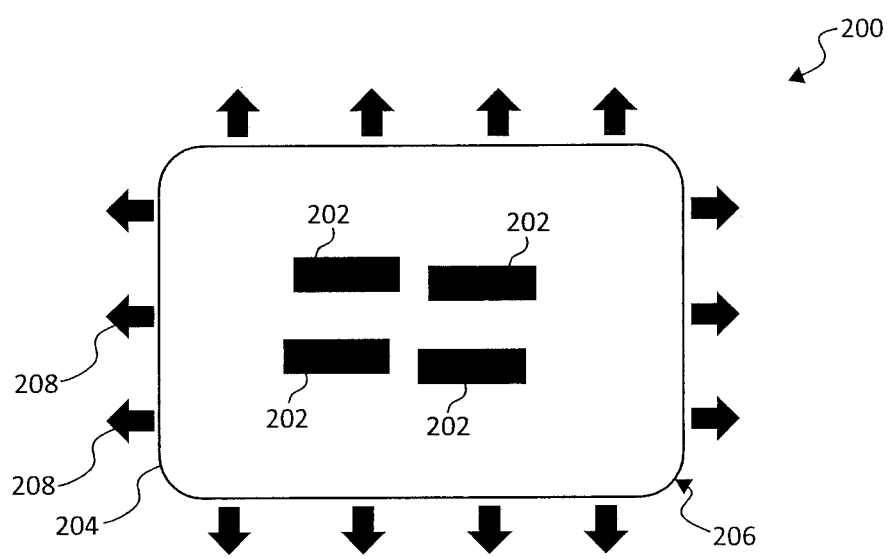
FIG. 2 is a diagrammatic illustration of a thermal model for vent-less device architectures.

FIG. 2 is a diagrammatic illustration of a thermal model 200 for vent-less device architectures. In FIG. 2, blocks 202 represent internal heat sources, which are enclosed in a vent-less casing/enclosure 204. An exterior surface 206 of casing 204 interfaces with the ambient environment. For such vent-less device architectures (e.g., enclosures that do not have a vent), natural convection and radiation (represented by arrows 208) from the exterior surface 206 of the device 200 are the thermal mechanisms for transferring heat to the ambient environment. The amount of heat energy transferred depends on the surface area, orientation, and the surface temperature distribution. To reach thermal equilibrium, the average surface temperature will rise until the amount of heat energy that is transferred to the ambient environment equals the amount that is generated internally during operation.

The passive cooling mechanisms described above in connection with FIG. 2 strongly depend upon the external surface area and temperature of the device. The greater the surface area and the higher the surface temperature, the greater will be the amount of heat energy that will be transferred to the ambient environment. FIGS. 3A and 3B together illustrate surface temperature dependence based on device size. FIG. 3A illustrates a device 300 with a relatively small casing/enclosure 204A. For small enclosures such as 204A, a higher surface temperature distribution is needed to achieve a higher energy density transfer of natural convection and radiation. FIG. 3B illustrates a device 302 with a relatively large casing/enclosure 204B. For large enclosures such as 204B, a lower surface temperature distribution is adequate to meet the lower energy density transfer of natural convection and radiation. As the device 300, 302 operates it generates heat, and the external surface temperature will continue to rise until the thermal transfer due to convection and radiation can match the thermal power that is generated. When this balance has been reached, the system has reached thermal equilibrium.

Figure 4:
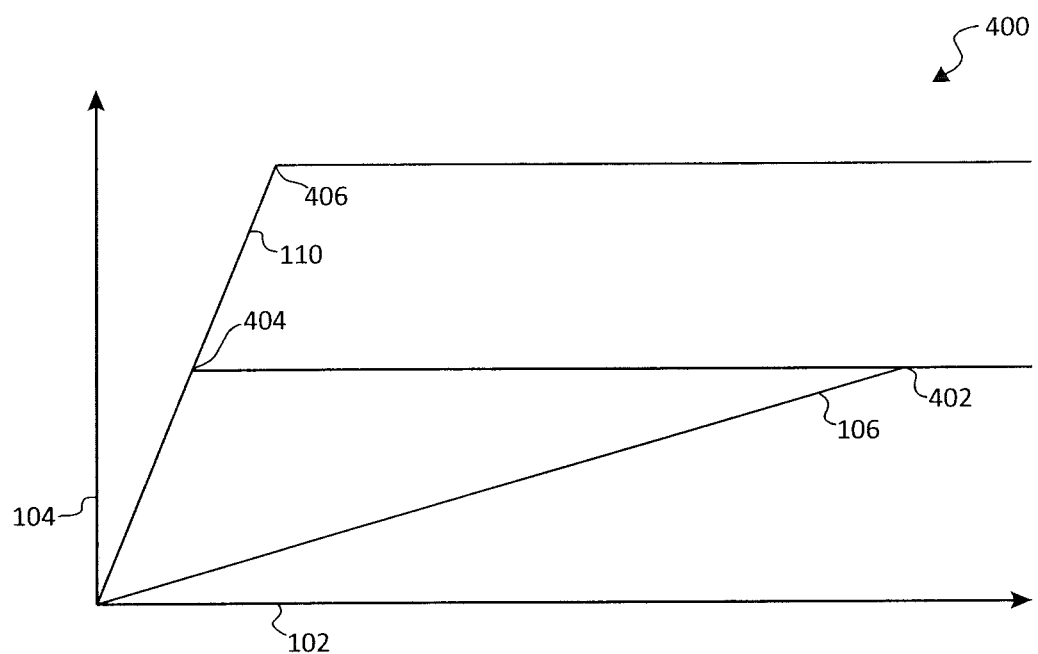
FIG. 4 is a graph that illustrates system temperature dependence on heat capacity and enclosure size.

FIG. 4 is a graph 400 that illustrates system temperature dependence on heat capacity and enclosure size. In FIG. 4, at point 402 of plot 106, thermal equilibrium is reached for a large heat capacity/small internal heat load system having a large enclosure. At point 404 of plot 110, thermal equilibrium is reached for a small heat capacity/large internal heat load system having a large enclosure. At point 406 of plot 110, thermal equilibrium is reached for a small heat capacity/large internal heat load system having a small enclosure. From FIG. 4, it is seen that the system temperature for reaching thermal equilibrium is highest for a system that has a small heat capacity/large internal heat load and a small enclosure.

Figure 5:
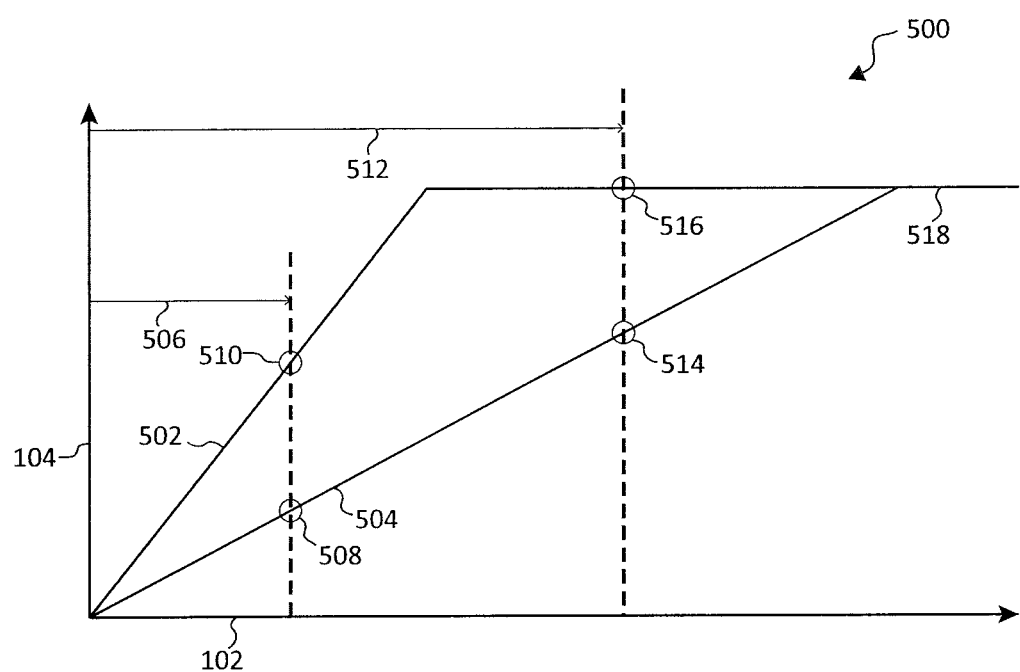
FIG. 5 is a graph that illustrates system temperature dependence on heat capacity when no phase change (PC) material is employed.

For portable devices that have infrequent heat load generation, the desired functional action, such as a transfer of data, may complete before the system reaches thermal equilibrium. In this scenario, there are multiple approaches to control and limit the component temperature in the time it takes to complete the functional action. One approach is to increase the heat capacity of the device to reduce the slope of the system temperature rise. This is shown in graph 500 of FIG. 5. In FIG. 5, plot 502 represents a small heat capacity system, and plot 504 represents a large heat capacity system. As can be seen in FIG. 5, for short data transfers such as 506, neither device configuration (small or large heat capacity) reaches thermal equilibrium when the data transfer 506 completes. In this scenario, the device with the larger heat capacity has a much lower system temperature 508 compared to system temperature 510 of the device with the smaller heat capacity. For long data transfers such as 512, the configuration with the smaller heat capacity reaches thermal equilibrium before the completion of the data transfer 512. In this scenario, the configuration with the larger heat capacity still exhibits a lower system temperature 514 compared to system temperature 516 of the device with the smaller heat capacity. However, the benefit is reduced due to the thermal equilibrium 518. If the time of data transfer continues indefinitely, the configuration with the large heat capacity will eventually reach thermal equilibrium 518, and there will be no difference in system temperature between the two configurations.

Figure 6:
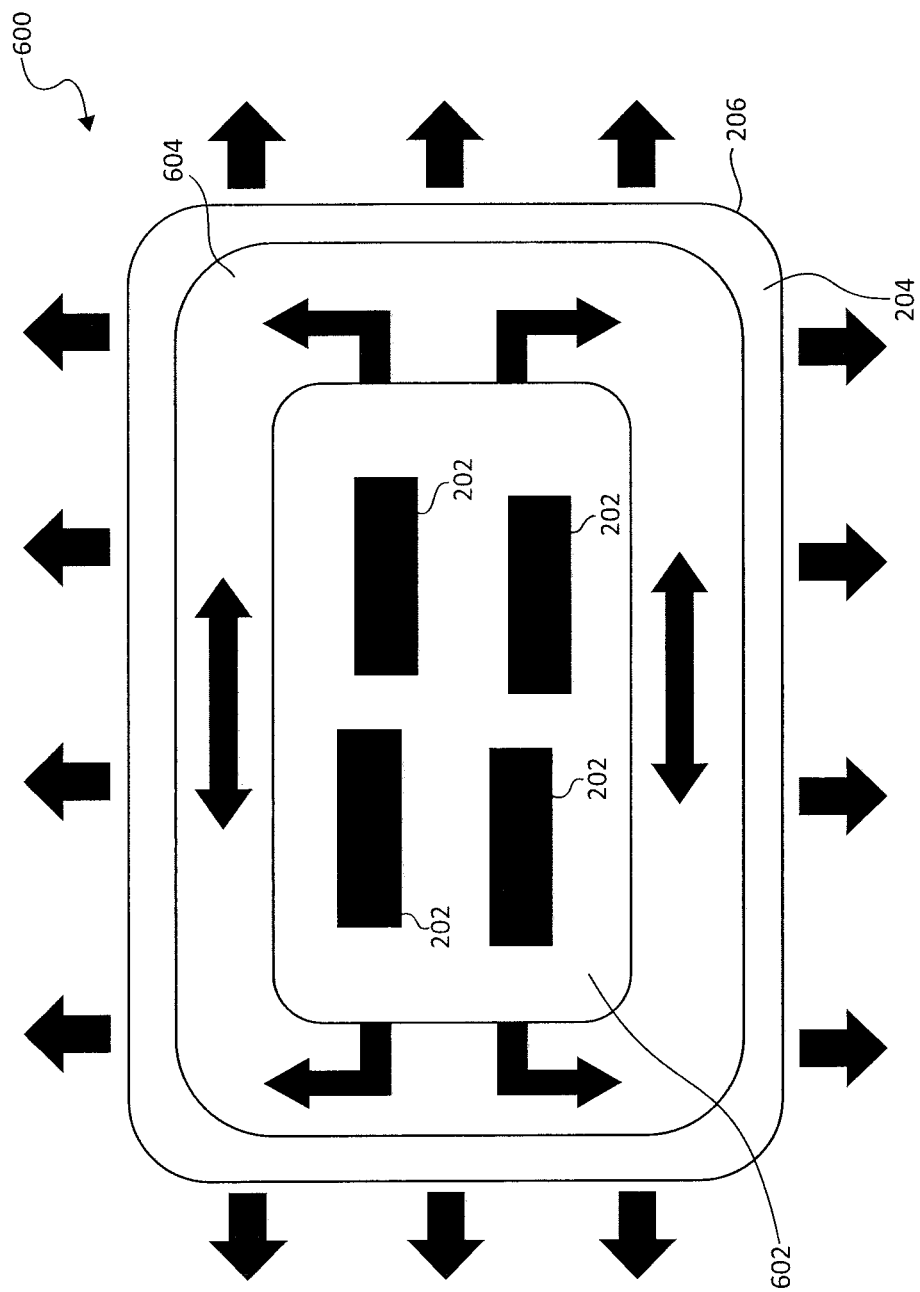
FIG. 6 is a diagrammatic illustration of an example vent-less device architecture with no PC material.

FIG. 6 is a diagrammatic illustration of an example vent-less device architecture 600. For vent-less device architectures such as 600, various thermal interface materials (TIMs) 602 (e.g., highly conductive thermal pads, which may be compressible pads (e.g., pads formed of a thermally conductive silicone rubber composition) or incompressible pads) may be employed to efficiently couple heat energy from internal heat sources 202 into a heat spreader 604. In some embodiments, heat spreader 604 may be a metal plate (e.g., an aluminum plate). The heat spreader 604 is employed to efficiently spread the heat energy to different regions of device enclosure wall 204. The heat energy conducts through the device enclosure wall 204 and is transferred to the ambient environment from external surface 206 of the device enclosure wall 204.

In one example, internal heat sources 202 are data storage elements and device 600 is a data storage device. In a particular embodiment, data storage device 600 is an SSD and at least one of internal heat sources 202 is a NAND Flash memory. Here, "system temperature" refers to a temperature of a data storage element (e.g., NAND Flash memory), which may have a low thermal margin (e.g., a least amount of thermal margin of the different device 600 components). As an example, when data is transferred to an external storage device (e.g., an external SSD), increasing the heat capacity of the device will lower the slope of the temperature rise and consequently reduce the component temperature reached during the data transfer. Unfortunately, increasing the device's heat capacity typically involves an increasing in the device's mass, which will result in a heavier device, and probably a larger device also, which is not a desirable characteristic for such a device.

To provide thermal rectification without substantially increasing the device's mass, embodiments of the disclosure employ a PC material to manage and limit, for example, infrequent heat loads. Such embodiments take advantage of a PC property, such as the latent heat of fusion, to absorb the heat when the temperature reaches the melting point of the PC material. Embodiments of devices (e.g., data storage devices) that employ PC materials are described below in connection with FIGS. 7-11.

Figure 7:
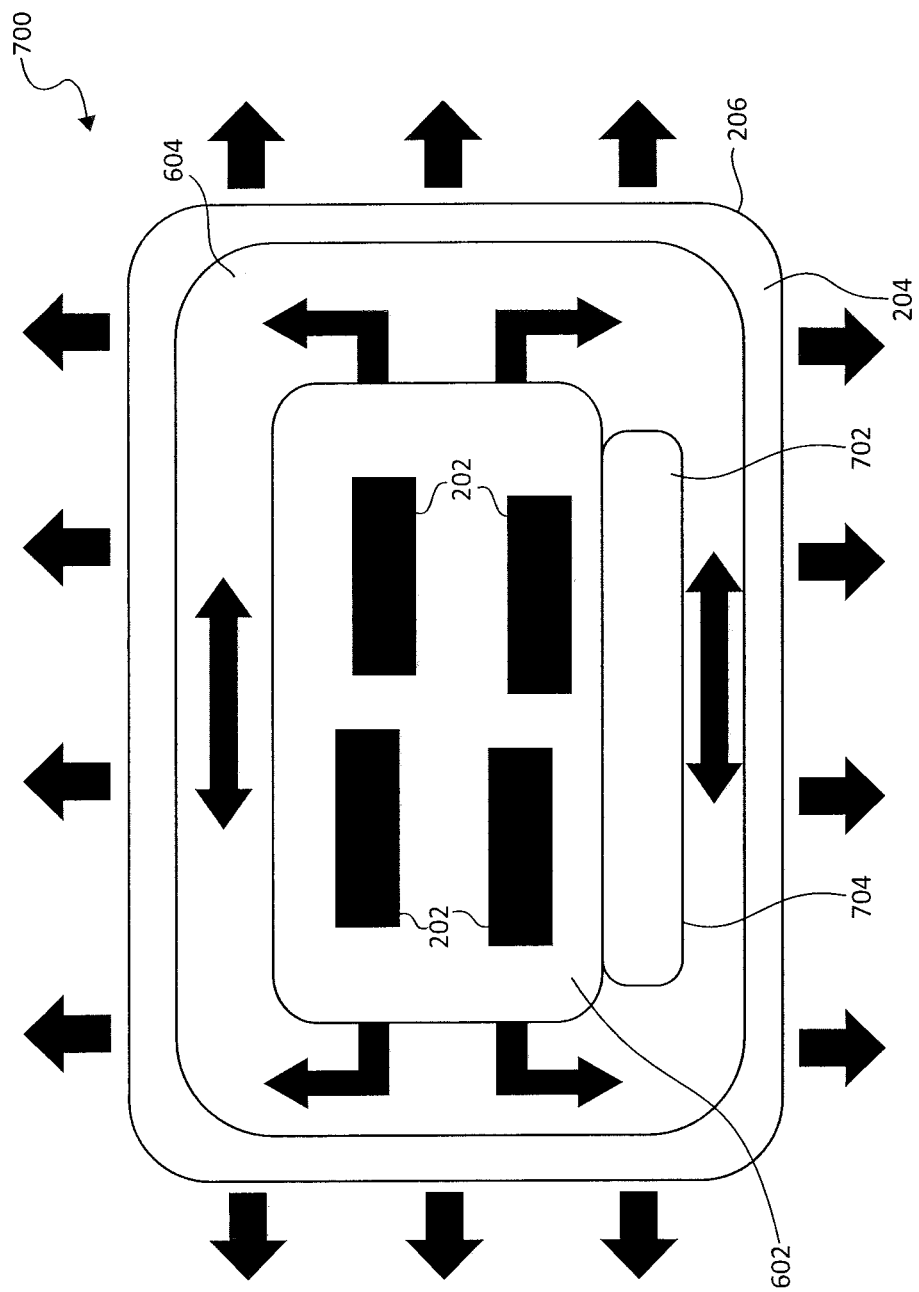
FIG. 7 is a diagrammatic illustration of a device that includes a PC material in accordance with one embodiment.

FIG. 7 is a diagrammatic illustration of a device (e.g., a data storage device) 700 that includes a PC material in accordance with one embodiment. In addition to including the elements shown in device 600 of FIG. 6, device 700 includes in one embodiment a PC material 702 in a liquid-tight container 704. Container 704 prevents the PC material 702 from escaping when it is in a liquid state, and thus protects the surrounding components in device 700. Examples of PC materials 702 include inorganic materials (e.g., salt and salt hydrates), organic compounds such as paraffins or fatty acids and polymeric materials (e.g., polyethylene glycol). In device 700, the PC material 702 is strongly thermally coupled to TIM 602 (e.g., liquid-tight container 704 is in contact with one or more TIM pads 602). In some embodiments, container 704 may be in direct contact with the heat source 202 instead of being thermally coupled to the heat source 202 via the TIM pads 602. It should be noted that, in certain embodiments, an engineered material that includes the PC material 702 and a binder may be employed instead of a separate container 704 and the PC material 702 within the container 704. In such embodiments, the engineered material for device 700 may simply be a small sheet cut out from a larger sheet of the engineered material.

With the addition of the strongly-coupled PC material 702, there is a low thermal resistance path between the internal heat sources 202 and the PC material 702. PC material 702 absorbs heat from the heat sources 202, and its temperature rises before it melts. Once the system temperature reaches Tm, the melting point of the PC material 702, the heat released by internal sources 202 is absorbed by the PC material 702 as latent heat. At this stage, the system temperature is held constant (thermal rectification) while the PC material 702 absorbs the released heat using the latent heat of fusion (melting process). The thermal rectification holds steady until all of the PC material has fully melted. At that point, the temperature rise will resume if the source of heat 202 has not ceased to generate thermal power. When the PC material 702 is sized appropriately, common data transfers will complete before the PC material 702 has completely melted. In some embodiments, device 700 may be an SSD employed in, for example, a gaming application in which frequent data transfers occur. Here, the frequent data transfers may bring the system to thermal equilibrium.

Figure 8:
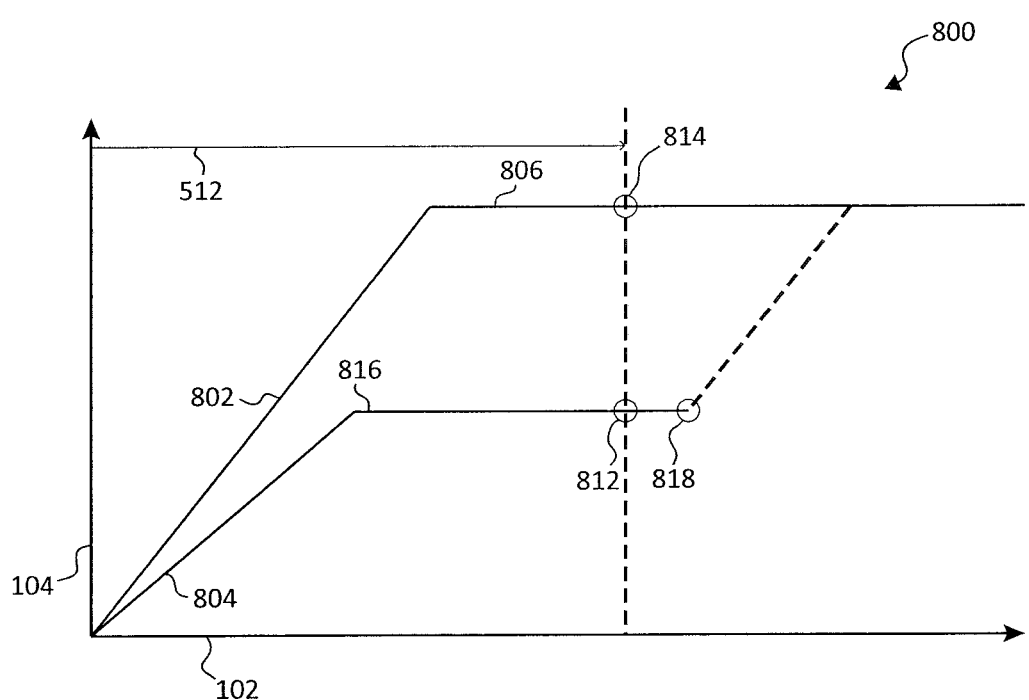
FIG. 8 is a graph that illustrates an influence of PC material on system temperature.

FIG. 8 is a graph 800 that illustrates an influence of PC material on system temperature. In FIG. 8, plot 802 represents a small heat capacity system with no PC material, and plot 804 represents a small heat capacity system with PC material. In the example shown in in FIG. 8, for long data transfers such as 512, the configuration without the PC material reaches thermal equilibrium 806 before the completion of the data transfer 512. However, as can be seen in FIG. 8, with the PC material, the system temperature 812 reached before the completion of the long data transfer 512 is Tm, which is substantially lower than the temperature 814 reached by the system without the PC material before the completion of the long data transfer 512. As can also be seen in FIG. 8, thermal rectification 816 holds steady until all of the PC material has fully melted at 818. Once this has occurred, if the source of heat 202 has not ceased to generate thermal power, the system temperature will resume rising and will eventually reach the thermal equilibrium level 806.

Figure 9:
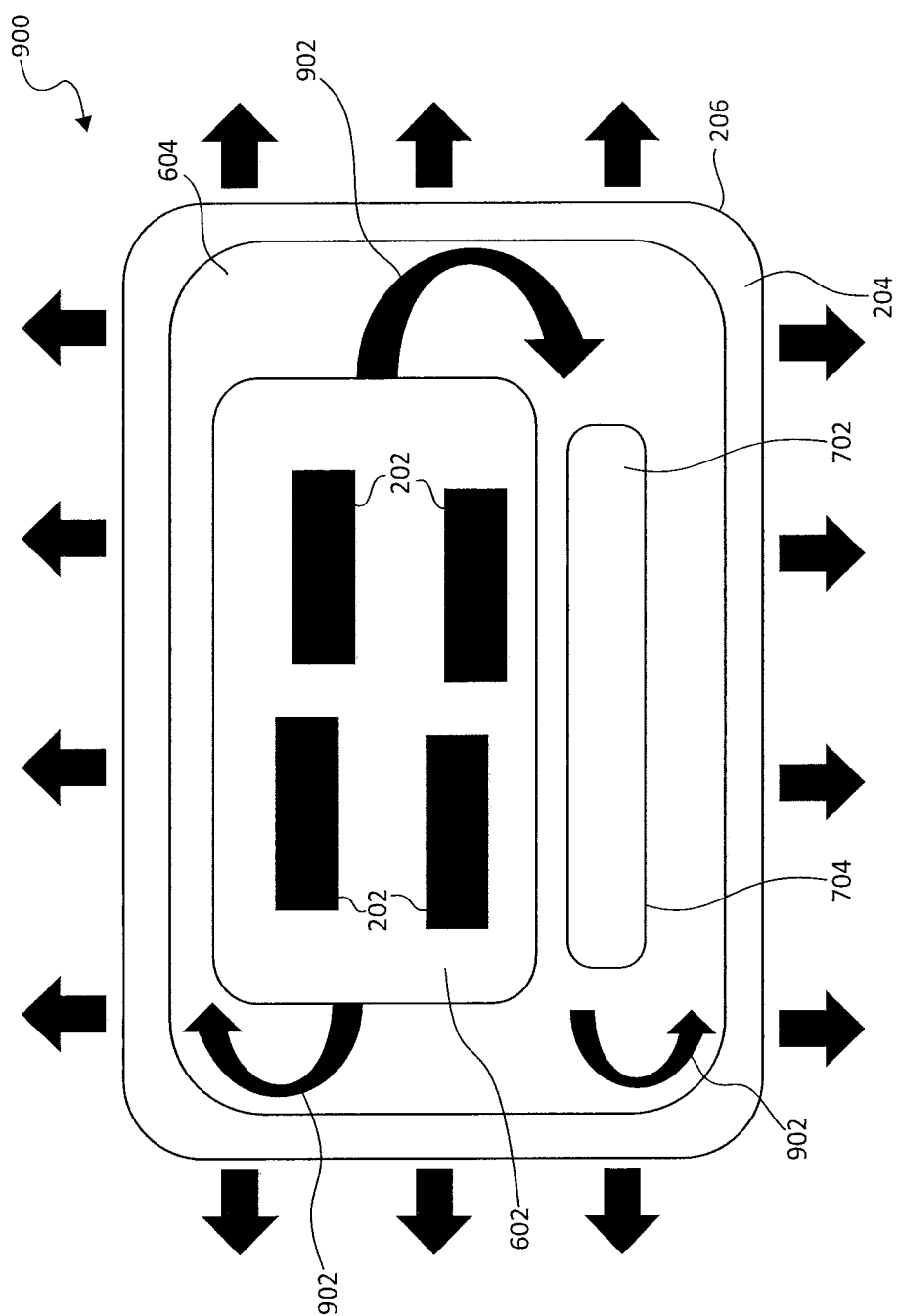
FIG. 9 is a diagrammatic illustration of a device that includes a PC material in accordance with another embodiment.

FIG. 9 is a diagrammatic illustration of a device (e.g., a data storage device) 900 that includes a PC material in accordance with another embodiment. Device 900 is similar to device 700 (of FIG. 7). However, unlike the strong coupling between the PC material 702 and the TIM 602 in device 700, PC material 702 is weakly coupled to TIM 602 in device 900. The weak coupling (or high thermal resistance to heat flow) is denoted by arrows 902. Further, no heat spreader 604 is included in device 900, and therefore PC material 702 is also weakly thermally coupled to enclosure 204 in device 900. Any material with a low thermal conductivity may surround the PC material container 704 in device 900. In one embodiment, device 900 may be an external SSD used for intermittent data transfers, which are not long enough to bring the system to a state of thermal equilibrium. Thus, such an embodiment does not rely on strong thermal conductivity from the heat source (e.g., solid-state memory) 202 to the enclosure wall 204. In general, for applications that have very infrequent and short duration operation, adding the PC material 702 allows the enclosure to be made very small with inexpensive, thermally-inefficient materials.

Figure 10:
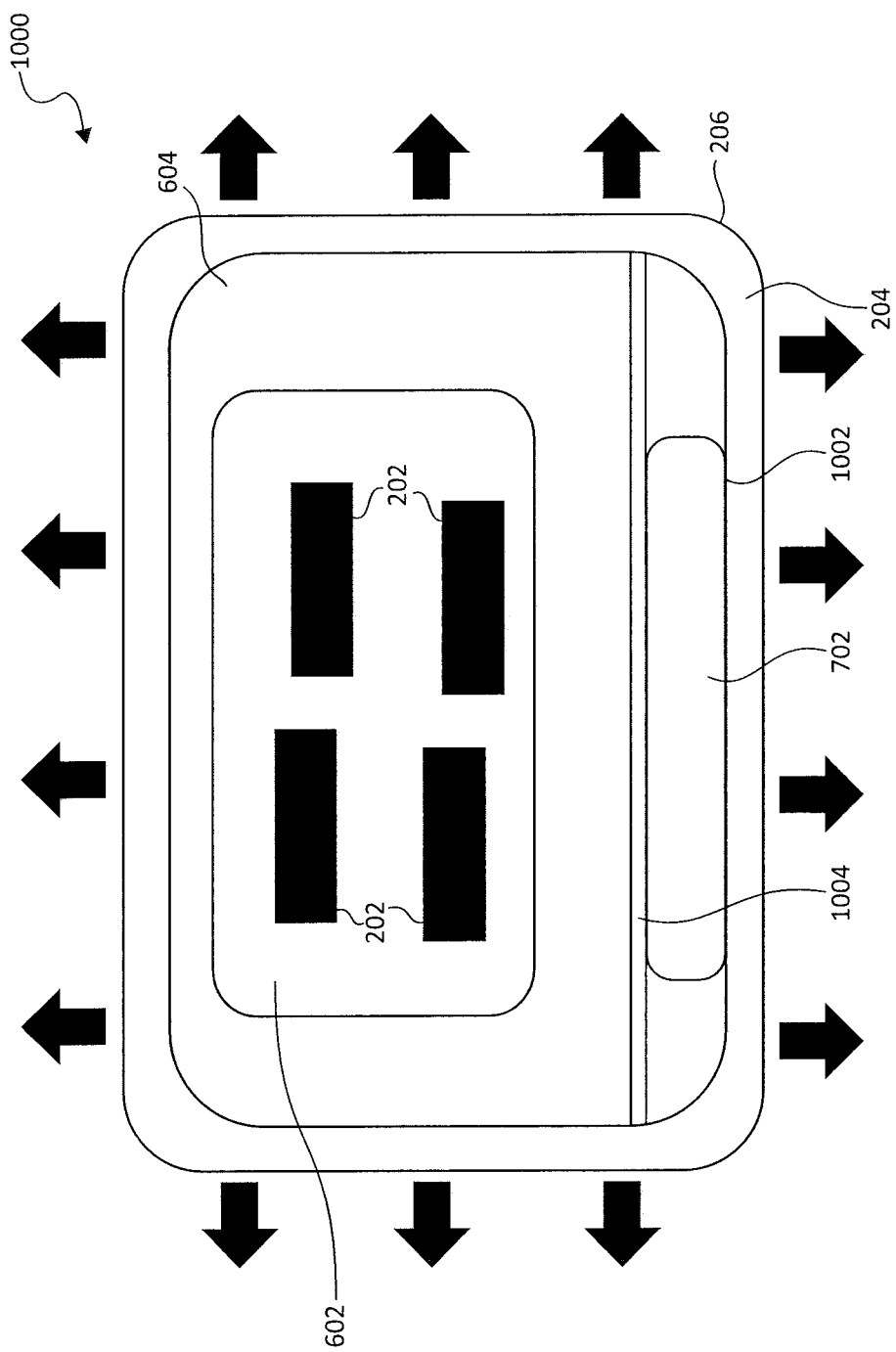
FIG. 10 is a diagrammatic illustration of a device that includes a PC material in accordance with yet another embodiment.

FIG. 10 is a diagrammatic illustration of a device (e.g., a data storage device) 1000 that includes a PC material in accordance with yet another embodiment. In device 1000, enclosure wall 204 includes a volume (e.g., a cavity 1002) for PC material 702. A membrane 1004 (e.g., an aluminum sheet having a suitable thickness (e.g., 0.2 millimeters)) covers the cavity 1002. Edges of membrane 1004 may be sealed to enclosure wall 204 with any suitable adhesive. It should be noted that the presence of the sealed membrane 1004 obviates any need for a separate liquid-tight container for the PC material 702 in this embodiment. Cavity 1002 may be positioned in any suitable location of the enclosure wall 204. In one embodiment, enclosure 204 may include a base and a top cover formed of, for example, aluminum. In such an embodiment, cavity 1002 may be included in the top cover. In another embodiment, the cavity may be included in the base of the enclosure. In general, cavity 1002 may be in any suitable location in the inside of the enclosure wall 204. In the embodiment of FIG. 10, no heat spreader 604 is included. However, other similar embodiments may include a heat spreader such as 604. In general, enclosure wall 204 may be formed of an suitable metal, plastic or other material.

Figure 11:
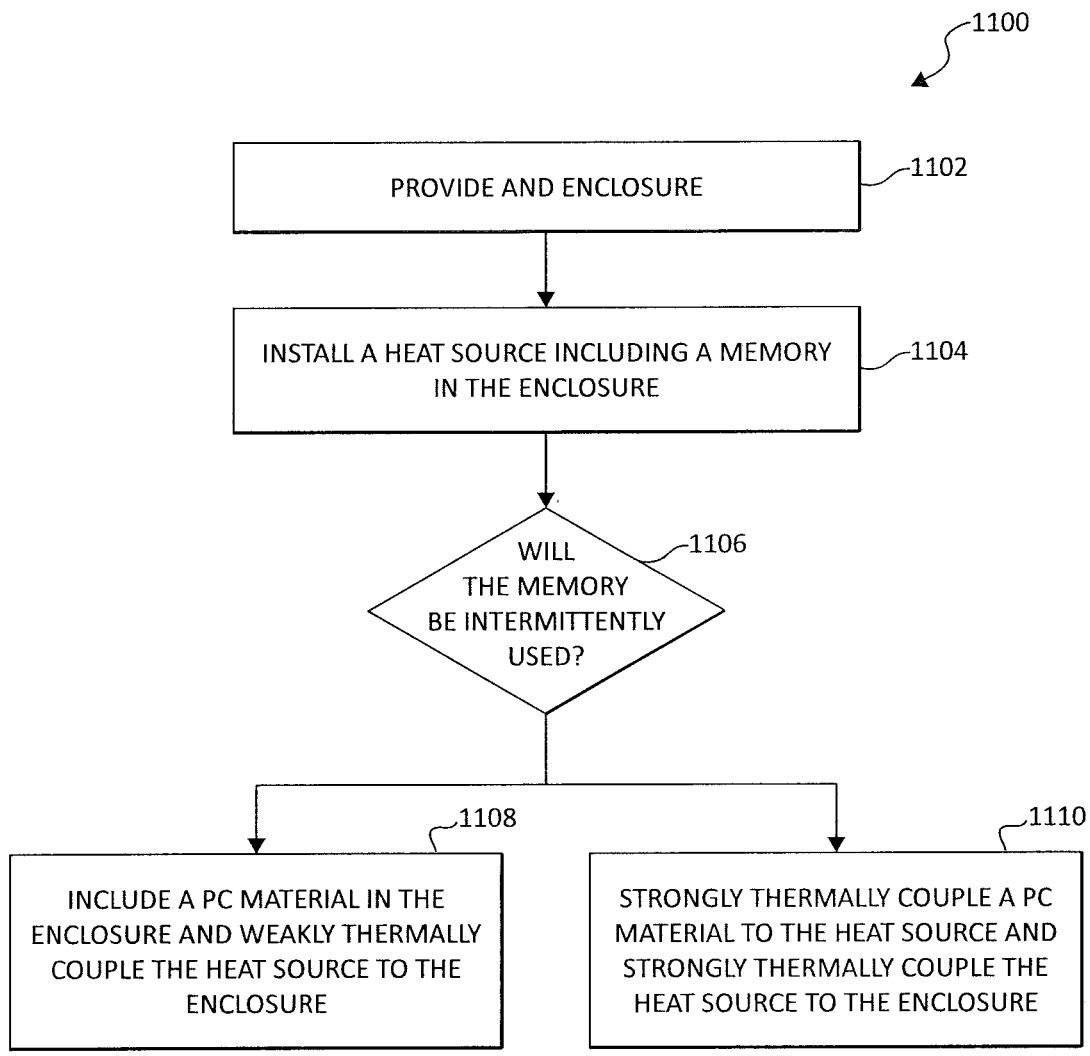
FIG. 11 is a flowchart of a method embodiment.

FIG. 11 is a flowchart of a method 1100 in accordance with one embodiment. The method 1100 includes providing an enclosure (e.g., a vent-less enclosure) at 1102. The method also includes installing a heat source including a memory (e.g., a solid-state memory) in the enclosure at 1104. At 1106, a determination is made as to whether the memory will be intermittently used. If the memory will be intermittently used, at 1108, a PC material is included in the enclosure and the heat source is weakly thermally coupled to the enclosure. When the memory is intermittently operated, the amount of heat energy generated is bounded such that a reasonable amount of PC material may be used to absorb the energy generated. The PC material included in the enclosure absorbs the heat energy created by the heat source (e.g., the intermittently used memory), so strong thermal coupling between the heat source and walls of the enclosure is not used.

If the memory will be frequently or substantially continuously used over relatively long periods of time (e.g., a few hours), at 1110, a PC material is included in the enclosure, and the PC material is strongly thermally coupled to the heat source. Also, the heat source is strongly thermally coupled to the enclosure. In this case, the amount of energy created by the internal heat source will typically, over the course of frequent or substantially continuous use, exceed the total amount of energy that can be absorbed by the PC material. Accordingly, stronger thermal coupling is provided between the heat source and the enclosure walls to maintain an acceptable internal steady-state temperature. The PC material should also be strongly coupled to the heat sources to absorb the initial heat energy generated and thus delay the rise of the temperature of the enclosure walls.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
   a heat source comprising a memory;
   an enclosure within which the heat source is installed;
   a heat spreader within the enclosure and surrounding the heat source;
   a thermal interface material within the enclosure, the thermal interface material being coupled to the heat source and to the heat spreader, thereby providing a first low thermal resistance path between the heat source and the heat spreader;
   a thermal energy absorption phase change material included in a contained that is directly coupled to the thermal interface material, the thermal energy absorption phase charge material being indirectly coupled to the heat source via the thermal interface material, such that the thermal interface material provides a second low thermal resistance path between the heat source and the phase change material; and
   at least portion of the first low thermal resistance path from the heat source and at least a portion of the second thermal resistance path from the heat source are separate from each other.

2. The data storage device of claim 1 and wherein the memory is a solid-state memory.

3. The data storage device of claim 1 and wherein the enclosure is vent-less.

4. The data storage device of claim 1 and wherein the container is a liquid-tight container that is separate from a wall of the enclosure and is directly coupled to the thermal material.

5. The data storage device of claim 1 and wherein the heat spreader comprises a metal plate.

6. The data storage device of claim 1 and wherein the thermal interface material comprises thermal interface material pads.

7. A method comprising:
   providing a vent-less enclosure;
   installing a heat source comprising a solid-state memory in the vent-less enclosure;
   introducing a phase change material within a liquid-tight container in the vent-less enclosure; and
   thermally coupling the phase change material to the heat source with a thermal coupling strength that is a function of a predetermined frequency of usage of the solid-state memory.

8. The method of claim 7 and further comprising
   providing a heat spreader within the enclosure; and
   coupling a thermal interface material to the heat source and to the heat spreader, thereby providing a first low thermal resistance path between the heat source and the heat spreader.

9. The method of claim 8 and further comprising coupling the phase change material to the thermal interface material such that the thermal interface material provides a second low thermal resistance path between the heat source and the phase change material.

10. The method of claim 7 and further comprising forming a portion of the liquid-tight container in a wall of the enclosure.

11. The method of claim 8 and wherein providing the heat spreader comprises providing a metal plate.

12. The data storage device of claim 8 and wherein coupling the thermal interface material to the heat source comprises coupling thermal interface material pads to the heat source.

13. A data storage device comprising:

a vent-less enclosure;

a heat source comprising a solid-state memory installed in the vent-less enclosure; and a phase change material within a liquid-tight container in the vent-less enclosure, the phase change material being thermally coupled to the heat source with a thermal coupling strength that is a function of a predetermined frequency of usage of the solid-state memory.

14. The data storage device of claim 13 and further comprising a thermal interface material coupled to the heat source.

15. The data storage device of claim 14 and wherein the phase change material is located between the thermal interface material and a wall of the enclosure such that a thermal coupling between the phase change material and the thermal interface material is weaker than a thermal coupling between the thermal interface material and the heat source.

16. The data storage device of claim 15 and wherein a thermal coupling between the phase change material and a wall of the vent-less enclosure is weaker than a thermal coupling between the thermal interface material and the heat source.

17. The data storage device of claim 13 and further comprising a heat spreader within the enclosure and surrounding the heat source.

18. The data storage device of claim 13 and wherein a portion of the liquid-tight container is formed by a wall of the enclosure.

* * * * *

UNITED STATES PATENT AND TRADEMARK OFFICE
CERTIFICATE OF CORRECTION

PATENT NO. : 10,980,152 B1  
APPLICATION NO. : 16/680059  
DATED : April 13, 2021  
INVENTOR(S) : Michael Morgan Page 1 of 1

It is certified that error appears in the above-identified patent and that said Letters Patent is hereby corrected as shown below:

In the Claims

Column 8, Claim 1, Line 23, please replace the word "contained" with the word --container--.

Column 8, Claim 1, Line 25, please replace the word "charge" with the word --change--.

Column 8, Claim 1, Line 25, please insert the word --entirely-- between the words "being" and "indirectly".

Column 8, Claim 1, Line 30, please insert the word --a-- between the words "least" and "portion".

Column 8, Claim 4, Lines 40-41, please insert the word --interface-- between the words "thermal" and "material".

Signed and Sealed this  
Twenty-ninth Day of June, 2021

Drew Hirshfeld  
*Performing the Functions and Duties of the  
Under Secretary of Commerce for Intellectual Property and  
Director of the United States Patent and Trademark Office*